United States Patent
Huo et al.

(10) Patent No.: US 8,324,861 B2
(45) Date of Patent: Dec. 4, 2012

(54) MULTI-CHANNEL CONVERTER WITH SELF-DIAGNOSIS FUNCTIONALITY

(75) Inventors: Xiaohua Huo, Pu Dong New Area (CN); Shiqiang Liu, Shenzhen (CN); Yingguo Zhang, Wuhan (CN)

(73) Assignee: O2Micro Inc., Santa Clara, CA (US)

( * ) Notice: Subject to any disclaimer, the term of this patent is extended or adjusted under 35 U.S.C. 154(b) by 944 days.

(21) Appl. No.: 12/398,376

(22) Filed: Mar. 5, 2009

(65) Prior Publication Data

US 2010/0225496 A1      Sep. 9, 2010

(51) Int. Cl.
*H02J 7/00*     (2006.01)
*H03M 1/10*    (2006.01)

(52) U.S. Cl. ........................ 320/116; 341/120

(58) Field of Classification Search .................. 320/116; 341/120

See application file for complete search history.

(56) References Cited

U.S. PATENT DOCUMENTS

| | | | |
|---|---|---|---|
| 4,429,576 A * | 2/1984 | Norris | 73/636 |
| 4,827,392 A * | 5/1989 | Miguchi | 363/56.03 |
| 7,009,537 B2 * | 3/2006 | Kabune | 341/120 |

* cited by examiner

*Primary Examiner* — M'Baye Diao

(57) ABSTRACT

An apparatus includes a plurality of channels, a converter, a control block and a counter. The channels can be used to measure a first plurality of signals. The converter can be used to convert the first plurality of signals into a second plurality of signals. The control block can be used to control the channels and the converter and to determine if any of the channels and the converter experience an abnormal condition. The counter can be used to count the number of times the channels and the converter experience an abnormal condition.

25 Claims, 4 Drawing Sheets

MULTI-CHANNEL CONVERTER WITH SELF-DIAGNOSIS FUNCTIONALITY

BACKGROUND

Currently, Li-ion batteries have been applied in green vehicles, such as electric vehicles (EVs) and hybrid electric vehicles (HEVs). The workable voltage of a single cell in a Li-ion battery is approximately 3-4 volts, but EVs and HEVs usually require higher voltages up to more than 100 volts. Usually, multiple cells are coupled to each other in series to drive EVs and HEVs.

In battery management, the status of the cells, such as cell voltage, cell temperature and cell current, is measured and sent to an analog-to-digital converter (ADC) by a plurality of analog channels. Usually, offset cancellation is done to improve the accuracy of the ADC. However, when an abnormal condition occurs in the analog channels and the ADC, the offset cancellation may not achieve its desired effect. Therefore, reliable operation of the battery may not be guaranteed.

SUMMARY

In one embodiment, an apparatus includes a plurality of channels, a converter, a control block and a counter. The channels can be used to measure a first plurality of signals. The counter can be used to convert the first plurality of signals into a second plurality of signals. The control block can be used to control the channels and the converter and to determine if any of the channels and the converter experience an abnormal condition. The counter can be used to count the number of times the channels and the converter experience an abnormal condition.

BRIEF DESCRIPTION OF THE DRAWINGS

Features and advantages of embodiments of the claimed subject matter will become apparent as the following detailed description proceeds, and upon reference to the drawings, wherein like numerals depict like parts, and in which:

DETAILED DESCRIPTION

Figure 1:
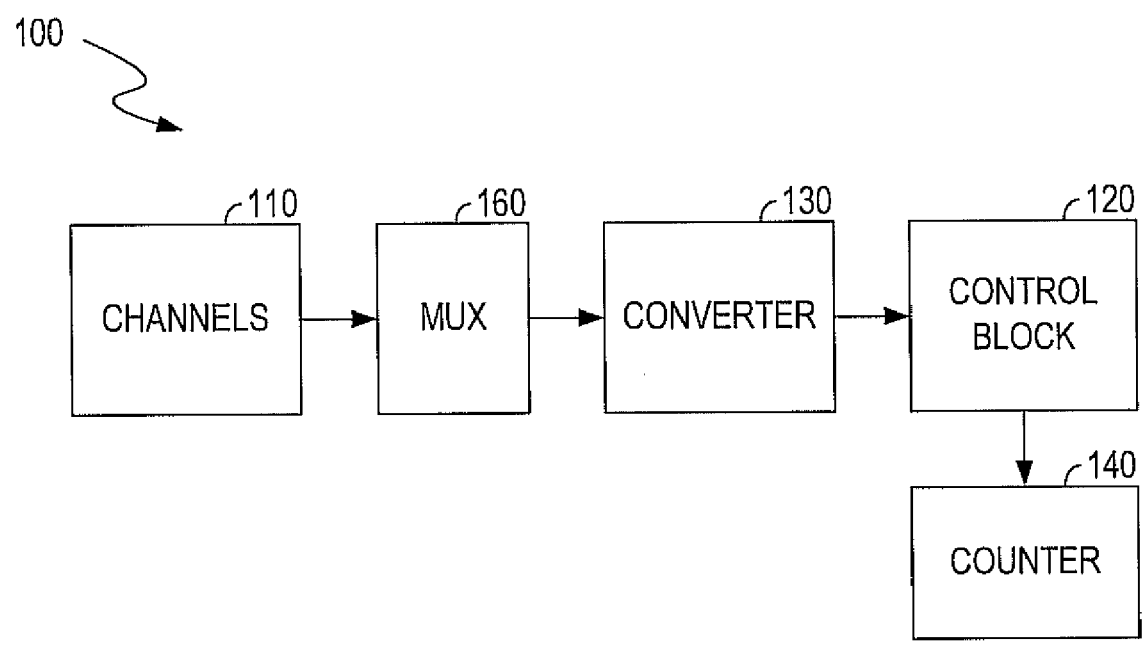
FIG. 1 is a block diagram showing a multi-channel converter with self-diagnosis functionality according to one embodiment of the present invention.

Reference will now be made in detail to the embodiments of the present invention. While the invention will be described in conjunction with the embodiments, it will be understood that they are not intended to limit the invention to these embodiments. On the contrary, the invention is intended to cover alternatives, modifications and equivalents, which may be included within the spirit and scope of the invention as defined by the appended claims.

Furthermore, in the following detailed description of the present invention, numerous specific details are set forth in order to provide a thorough understanding of the present invention. However, it will be recognized by one of ordinary skill in the art that the present invention may be practiced without these specific details. In other instances, well known methods, procedures, components, and circuits have not been described in detail as not to unnecessarily obscure aspects of the present invention.

Some portions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing the terms such as "measuring," "counting," "sending," "detecting," "converting," "comparing," "determining" or the like, refer to the actions and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

Embodiments described herein may be discussed in the general context of computer-executable instructions residing on some form of computer-usable medium, such as program modules, executed by one or more computers or other devices. Generally, program modules include routines, programs, objects, components, data structures, etc., that perform particular tasks or implement particular abstract data types. The functionality of the program modules may be combined or distributed as desired in various embodiments.

By way of example, and not limitation, computer-usable media may comprise computer storage media and communication media. Computer storage media includes volatile and nonvolatile, removable and non-removable media implemented in any method or technology for storage of information such as computer-readable instructions, data structures, program modules or other data. Computer storage media includes, but is not limited to, random access memory (RAM), read only memory (ROM), electrically erasable programmable ROM (EEPROM), flash memory or other memory technology, compact disk ROM (CD-ROM), digital versatile disks (DVDs) or other optical storage, magnetic cassettes, magnetic tape, magnetic disk storage or other magnetic storage devices, or any other medium that can be used to store the desired information.

Communication media can embody computer-readable instructions, data structures, program modules or other data in a modulated data signal such as a carrier wave or other transport mechanism and includes any information delivery media. The term "modulated data signal" means a signal that has one or more of its characteristics set or changed in such a manner as to encode information in the signal. By way of example, and not limitation, communication media includes wired media such as a wired network or direct-wired connection, and wireless media such as acoustic, radio frequency (RF), infrared and other wireless media. Combinations of any of the above should also be included within the scope of computer-readable media.

FIG. 1 shows a multi-channel converter 100 with self-diagnosis functionality according to one embodiment of the present invention. The multi-channel converter 100 can be implemented as an integrated chip (IC). In the embodiment of FIG. 1, the multi-channel converter 100 includes a plurality of channels 110, a multiplexer (MUX) 160, a converter 130, a control block 120 and a counter 140.

The plurality of channels 110 can measure a first plurality of signals and provide the signals to the multiplexer (MUX) 160. The MUX 160 can select an instance of the first plurality of signals and provide the selected instance to the converter 130. The converter 130 can convert each instance into a signal which is in a desired format to produce a second plurality of signals. A plurality of control signals (not shown) can be sent from the control block 120, for example, to control the MUX 160.

In one embodiment, the channels 110 can be analog channels for measuring analog signals and the converter 130 can be an analog-to-digital converter (ADC). In another embodiment, the channels 110 can be digital channels for measuring digital signals and the converter 130 can be a digital-to-analog converter (DAC).

Advantageously, at a designated self-diagnosis time, the control block 120 determines if any of the channels 110 and the converter 130 experience an abnormal condition, in one embodiment. In one embodiment, self-diagnosis is performed each time the IC wakes up from a sleep mode. The counter 140 can count the number of times that the channels 110 and the converter 130 experience an abnormal condition. When the number reaches a predetermined value, the IC can issue an alert signal (not shown) and the IC can stop operation.

Figure 2:
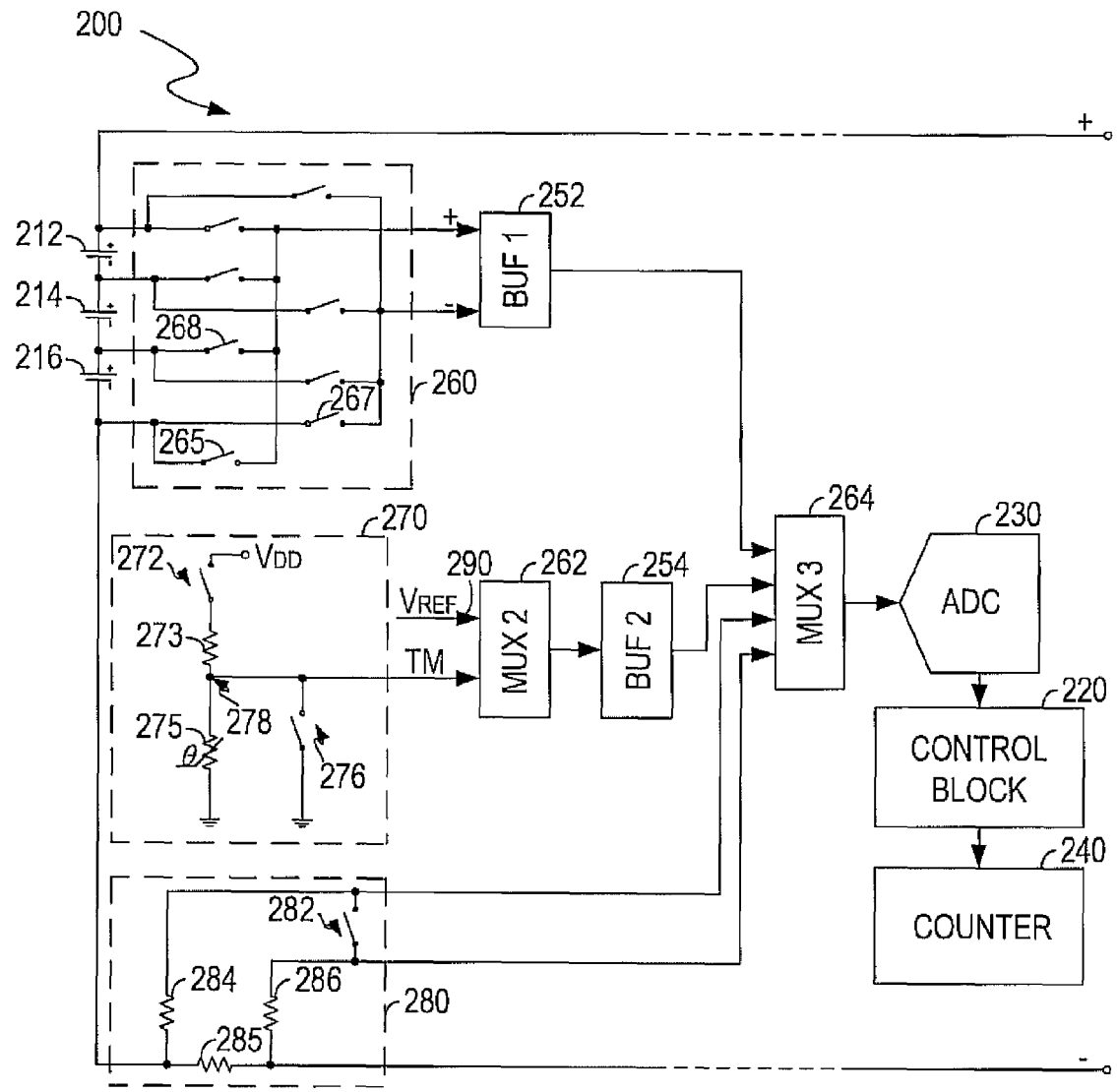
FIG. 2 is a block diagram showing a multi-channel ADC with self-diagnosis functionality according to one embodiment of the present invention.

FIG. 2 shows a block diagram of a multi-channel ADC 200 for monitoring a battery according to one embodiment of the present invention. The multi-channel ADC 200 can be implemented as a battery management IC. The battery includes cells 212, 214 and 216. Although three cells are shown in FIG. 2, the present invention is not so limited. In other embodiments, the battery may include more than three or less than three cells.

In the embodiment of FIG. 2, the multi-channel ADC 200 includes an ADC 230, a counter 240, buffers 252 and 254, MUXs 260, 262 and 264, a temperature sense block 270, a current sense block 280, and a control block 220. The buffers 252 and 254 respectively regulate a difference between the voltages at input terminals within a proper range. An external power supply, $V_{DD}$, can be coupled to the temperature sense block 270 to supply electric power. An external accurate reference voltage $V_{REF}$ 290 can be input into the MUX 262 to measure the accuracy of the ADC 230.

Analog channels are included in the multi-channel ADC 200 to measure the status of the cells in the battery and the offsets of the status of the cells, and provide the status and the offsets of the status to the MUX 264 and the ADC 230. The analog channels can include a cell voltage channel that includes the MUX 260 and the buffer 252, a cell temperature channel that includes the temperature sense block 270, the MUX 262 and the buffer 254, and a cell current channel that includes the current sense block 280.

The MUX 260, the temperature sense block 270 and the current sense block 280 can be used to measure the status of the cells 212, 214 and 216, such as the cell 212 voltage, the cell 214 voltage, the cell 216 voltage, the cell temperature and the cell current, and can also be used to measure the offsets of the status of the cells, such as the cell 212 voltage offset, the cell 214 voltage offset, the cell 216 voltage offset, the temperature offset and the cell current offset, by a short-circuit mechanism described below. The offsets of the status of the cells are the difference between the status of cells that is measured and the status of the cells. For example, the cell 212 voltage offset is the difference between the cell 212 voltage that is measured by the cell voltage channel and the voltage of the cell 212. The offsets of the status of the cells can be measured for the offset cancellation and for determining if any of the analog channels experiences an abnormal condition as described below.

In the embodiment of FIG. 2, the MUX 260 is coupled to the cells 212, 214 and 216 to output the voltages at the positive terminals and the negative terminals of the cells 212, 214 and 216 to the buffer 252. Switches in the MUX 260 couple the positive terminals of the cells 212, 214 and 216, one at a time, and the negative terminal of the cell 216 to a non-inverting input terminal of the buffer 252, in one embodiment. Switches in the MUX 260 couple the negative terminals of the cells 212, 214 and 216, one at a time, and the positive terminal of the cell 212 to an inverting input terminal of the buffer 252, in one embodiment. The signal output by the buffer 252 is the voltage difference between the voltages at the two input terminals.

To measure the cell 216 voltage, for example, a switch 268 is turned on to provide the voltage at the positive terminal of the cell 216 to the non-inverting input terminal of the buffer 252, and a switch 267 is turned on to provide the voltage at the negative terminal of the cell 216 to the inverting input terminal of the buffer 252; thus, the signal output by the buffer 252 is the cell 216 voltage. To measure the cell 216 voltage offset, for example, the switch 267 and a switch 265 are turned on to provide the voltage at the negative terminal of the cell 216 to the two input terminals of the buffer 252; thus, the signal output by the buffer 252 is the cell 216 voltage offset. Similarly, the cell 212 voltage, the cell 212 voltage offset, the cell 214 voltage and the cell 214 voltage offset can be measured.

In the embodiment of FIG. 2, the temperature sense block 270 includes switches 272 and 276, a resistor 273, and a thermistor 275, and outputs a signal TM to the MUX 262. The switch 272, the resistor 273 and the thermistor 275 are coupled to each other in series to couple the external power supply $V_{DD}$ to ground. A node 278 between the resistor 273 and the thermistor 275 is coupled to the MUX 262, and is coupled to ground by the switch 276. The signal TM output to the MUX 262 is the voltage at the node 278, and the amount of this voltage corresponds to the cell temperature. Thus, the cell temperature can be measured by turning on the switch 272, and the cell temperature offset can be measured by turning on the switch 276.

In the embodiment of FIG. 2, the current sense block 280 includes a switch 282 and resistors 284, 285 and 286, and outputs two signals to the MUX 264. The voltage difference between the two signals is the voltage drop across the resistor 285, and the amount of this voltage drop corresponds to the cell current flowing through the resistor 285. Thus, the cell current can be measured by turning off switch 282, and the cell current offset can be measured by turning on the switch 282.

Therefore, the offsets of the statuses of the cells, such as the cell 212 voltage offset, the cell 214 voltage offset, the cell 216 voltage offset, the cell temperature offset and the cell current offset, can be measured by a short-circuit mechanism, and thus the offsets of statuses of the cells do not easily suffer from disturbances from external devices.

In the embodiment of FIG. 2, the external accurate reference voltage $V_{REF}$ 290, which is input into the MUX 262, is used to measure the accuracy of the ADC 230. The reference voltage $V_{REF}$ 290 is fully independent with a reference voltage (not shown) input into the ADC 230, in one embodiment. The reference voltage $V_{REF}$ 290 is converted by the ADC 230, and thus the accuracy of the ADC 230 can be measured by the converted value of the reference voltage $V_{REF}$ 290. Therefore, the cost of the multi-channel ADC 200 can be decreased since additional hardware devices are not needed to measure the accuracy of the ADC 230.

The buffer 252 receives the two signals output by the MUX 260, regulates the voltage difference between these two signals to be within a proper range, and then provides the regulated voltage to the MUX 264. The MUX 262 is used to select a signal in the two input signals, which are the accurate reference voltage $V_{REF}$ 290 and the signal TM, and to output the selected signal to the buffer 254. The buffer 254 regulates the signal output by the MUX 262 to within a proper range and then provides the regulated signal to the MUX 264. The MUX 264 selects a signal in the signal output by the buffer 252, the signal output by the buffer 254 and the two signals output by the current sense block 280, and provides the selected signal to the ADC 230. Then, the ADC 230 converts this signal, which is an analog signal, into a digital signal.

In one embodiment, control signals (not shown) can be sent from the control block 220, for example, to control the MUXs 260, 262 and 264 and the switches 272, 276 and 282. Thus, the status of the cells and the offset of the status of the cells can be measured and provided to the ADC 230 in response to the control signals.

At a designated self-diagnosis time, the offsets of the status of the cells and the accuracy of the ADC 230 are measured. In one embodiment, self-diagnosis is performed each time the battery management IC wakes up from a sleep mode. In other words, the offsets of the status of the cells and the accuracy of the ADC 230 are not measured during operation. Therefore, the values of the offsets are relatively more accurate and the offset cancellation can achieve its desired effect.

As described above, analog channels are included in the multi-channel ADC 200 to measure the offsets of the status of the cells by a short-circuit mechanism. In a normal condition, the offset measured by an analog channel is 0 or is within a predetermined range (below a predetermined threshold); and in an abnormal condition (some type of error occurs in the analog channel), the offset measured by this analog channel is not 0 or is outside the predetermined range (or exceeds the predetermined threshold).

In one embodiment, a predetermined range is set for each of the offsets to determine if the channel which measures the offset experiences an abnormal condition. Similarly, a predetermined range is set for the converted value of the reference voltage $V_{REF}$ 290 to determine if the ADC 230 experiences an abnormal condition. The counter 240 counts the number of times the channels and the ADC 230 experience an abnormal condition.

To determine if the cell voltage channel experiences an abnormal condition, at the self-diagnosis time, the cell 212 voltage offset, the cell 214 voltage offset and the cell 216 voltage offset are measured by the cell voltage channel and output to the ADC 230. The ADC 230 converts the cell 212 voltage offset, the cell 214 voltage offset and the cell 216 voltage offset and outputs the converted offsets to the control block 220. Then, the control block 220 determines if each of the converted offsets is within the predetermined range. In one embodiment, if each of the converted offsets is within the predetermined range, the cell voltage channel is determined to be in a normal condition. Otherwise, the cell voltage channel is determined to experience an abnormal condition and the number counted by the counter 240 is increased by one, in one embodiment. Similarly, abnormal conditions of the cell current channel, the cell temperature channel and the ADC 230 can be detected and counted.

Once the number counted by the counter 240 reaches a predetermined value, the battery management IC sends an alert signal to the external device and the battery management IC stops operation, in one embodiment.

Figure 3:
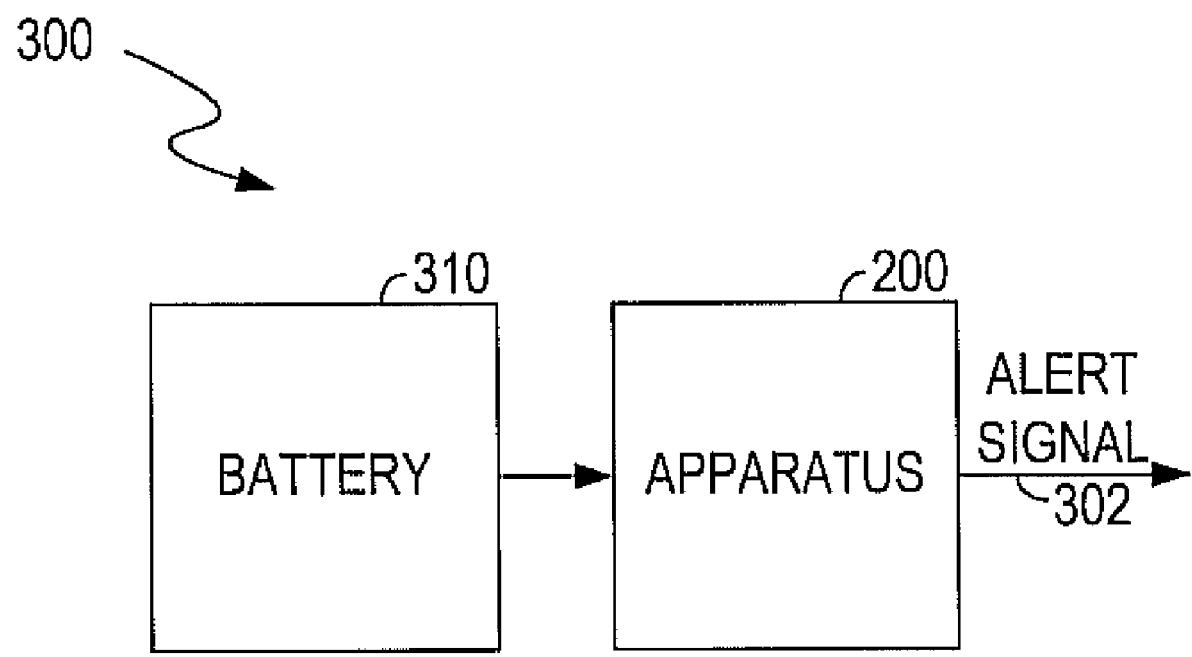
FIG. 3 is a block diagram showing a battery management system according to one embodiment of the present invention.

FIG. 3 shows a battery management system 300 according to one embodiment of the present invention. The battery management system 300 includes a battery 310 which includes a plurality of cells and an apparatus 200. The apparatus 200 in the battery management system 300 is similar to the apparatus 200 shown in the FIG. 2.

The apparatus 200 can be used to measure status of the cells in the battery 310 by a plurality of analog channels in the apparatus 200 and convert the status which is an analog signal into a digital signal by an ADC in the apparatus 200. In one embodiment, the apparatus 200 can be implemented as a battery management IC.

In one embodiment, at a designated self-diagnosis time, the offsets of the status of the cells and the accuracy of the ADC are measured by the apparatus 200. An abnormal condition of an analog channel in the apparatus 200 can be determined by comparing the offset of the status which is measured by this analog channel to a predetermined range as described above. An abnormal condition of the ADC in the apparatus 200 can be determined using a reference voltage as described above. When the number of the times the analog channels and the ADC experience the abnormal condition reaches a predetermined value, the apparatus 200 issues an alert signal 302 and the apparatus 200 can stop operation.

Figure 4:
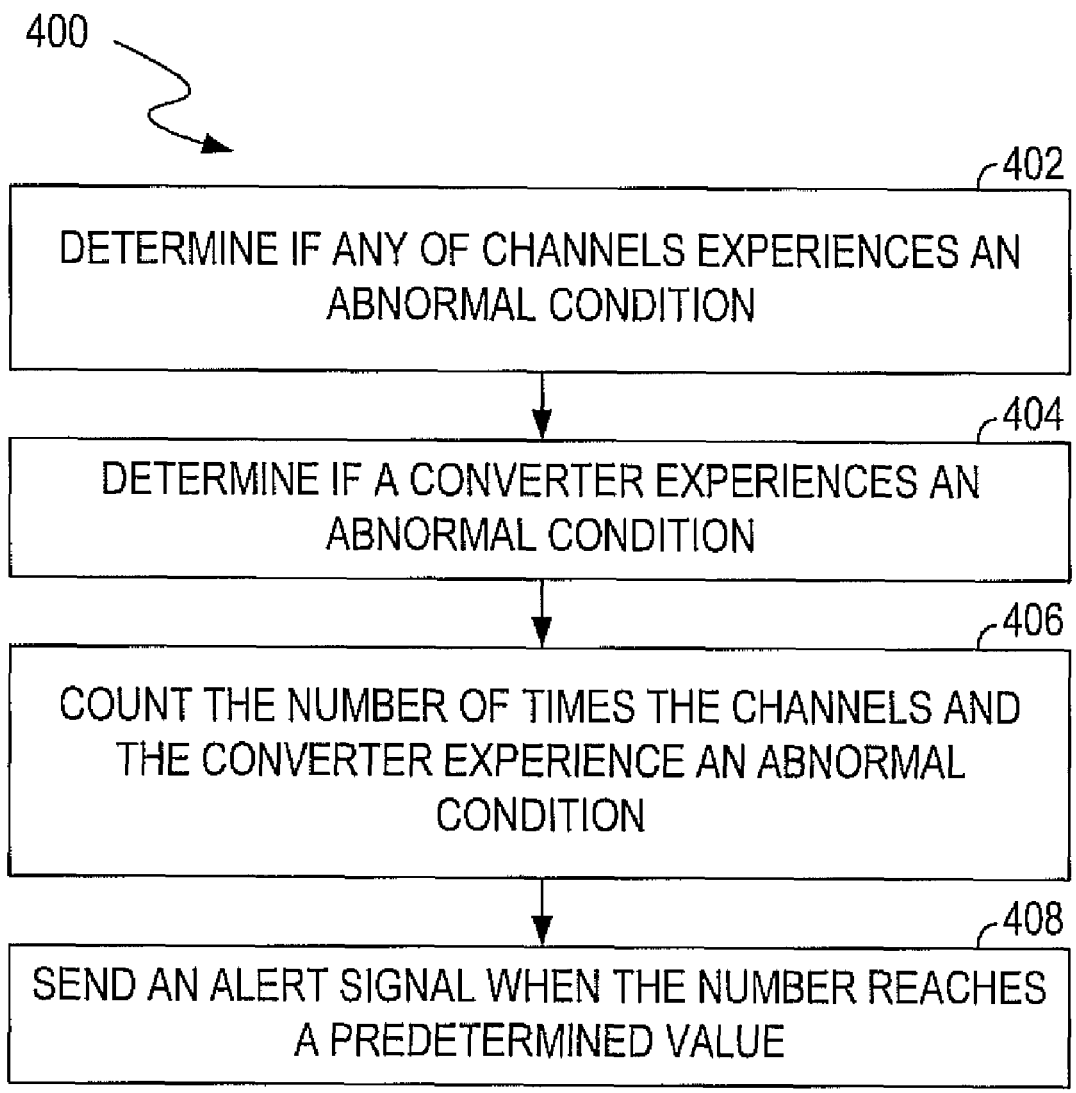
FIG. 4 is a flowchart of operations performed by a multi-channel ADC according to one embodiment of the present invention.

FIG. 4 shows a flowchart 400 of operations performed by a multi-channel converter according to one embodiment of the present invention. FIG. 4 is described in combination with FIG. 2. Although an embodiment in which analog channels produce analog signals that are converted into digital signals by an ADC is described below, the present invention is not so limited. The description below can be analogously applied to an embodiment in which digital channels produce digital signals that are converted into analog signals by a DAC as discussed in conjunction with FIG. 1.

At 402, at the designated self-diagnosis time, the control block 220 determines if any of the channels experiences an abnormal condition. In one embodiment, the offsets of the status of the cells 212, 214 and 216 can be measured by analog channels such as the cell voltage channel, the cell temperature channel and the cell current channel as described above. In such an embodiment, the offsets of the status of the cell 212, 214 and 216, which are analog signals, are then converted into respective digital signals by the ADC 230. Then, the respective digital signals are compared to respective predetermined ranges by the control block 220 to determine if any of the analog channels experience the abnormal condition. If the digital signal is not within the predetermined range, the analog channel is determined to experience the abnormal condition. In one embodiment, self-diagnosis is performed each time the battery management IC wakes up from a sleep mode.

At 404, at the designated self-diagnosis time, the control block 220 determines if the ADC 230 experiences the abnormal condition. The reference voltage $V_{REF}$ 290 is converted by the ADC 230 and the converted value is output to the control block 220. Then, the converted value is compared to a predetermined range to determine if the ADC experiences the abnormal condition. If the converted value is not within the predetermined range, the ADC is determined to experience the abnormal condition.

At 406, the number of times the analog channels and the ADC 230 experience the abnormal conditions is counted by the counter 240. In one embodiment, when one of the analog channels is determined to experience the abnormal condition, the number counted by the counter 240 is increased by one. Similarly, when the ADC 230 is determined to experience the abnormal condition, the number counted by the counter 240 is increased by one, in one embodiment.

At 408, when the number counted by the counter 240 reaches a predetermined value, the battery management IC sends an alert signal to the external devices and the battery management IC stops operation.

To summarize, in conventional applications, if an abnormal condition occurs in the channels and the converter, the offset cancellation may not achieve its desired effect. In contrast, according to embodiments of the present invention, the multi-channel converter has a self-diagnosis functionality: at a designated self-diagnosis time, the counter counts the number of times the channels and the converter experience an abnormal condition, and when the number reaches a predetermined value, the multi-channel converter can issue an alert signal and can stop operation. Advantageously, in a battery management application, to determine if any of the analog channels experiences an abnormal condition, the offsets of status of the cells are measured using a short-circuit mechanism, and thus the offsets do not easily suffer from disturbances from external devices. Furthermore, the self-diagnosis is not performed during operation. Therefore, the values of the offsets are relatively more accurate and so the offset cancellation can achieve its desired effect.

While the foregoing description and drawings represent embodiments of the present invention, it will be understood that various additions, modifications and substitutions may be made therein without departing from the spirit and scope of the principles of the present invention as defined in the accompanying claims. One skilled in the art will appreciate that the invention may be used with many modifications of form, structure, arrangement, proportions, materials, elements, and components and otherwise, used in the practice of the invention, which are particularly adapted to specific environments and operative requirements without departing from the principles of the present invention. The presently disclosed embodiments are therefore to be considered in all respects as illustrative and not restrictive, the scope of the invention being indicated by the appended claims and their legal equivalents, and not limited to the foregoing description.

What is claimed is:

1. An apparatus, comprising:
a plurality of channels operable for measuring a first plurality of signals indicative of status of a battery comprising a plurality of cells, said channels comprising:
a cell voltage channel operable for measuring the cell voltages of said cells, said cell voltage channel comprising:
a first multiplexer (MUX) coupled to said cells and operable for outputting the voltages at positive terminals and negative terminals of said cells; and
an output unit coupled to said first MUX and operable for outputting said cell voltages;
a converter operable for converting said first plurality of signals into a second plurality of signals;
a control block operable for determining if any of said channels and said converter experience an abnormal condition; and
a counter coupled to said control block and operable for counting the number of times said channels and said converter experience an abnormal condition.

2. The apparatus of claim 1, wherein when said number reaches a predetermined value, said control block issues an alert signal.

3. The apparatus of claim 1, wherein said control block determines if any of said channels and said converter experience said abnormal condition at a designated self-diagnosis time.

4. The apparatus of claim 3, wherein said designated self-diagnosis time comprises each time that said apparatus wakes up from a sleep mode.

5. The apparatus of claim 1, further comprising:
a second MUX coupled to said channels and said converter and operable for selecting an instance of said first plurality of signals and providing said instance to said converter.

6. The apparatus of claim 1, wherein said channels are analog channels.

7. The apparatus of claim 1, wherein said channels are used to measure offsets of said status.

8. The apparatus of claim 7, wherein said abnormal condition of said channels is determined by comparing said offsets of said status to a plurality of predetermined ranges.

9. The apparatus of claim 1, wherein said abnormal condition of said converter is determined using a reference signal.

10. The apparatus of claim 1, wherein said first MUX comprises:
a first plurality of switches coupled to said positive terminals of said cells and operable for providing said voltages at said positive terminals to said output unit; and
a second plurality of switches coupled to said negative terminals of said cells and operable for providing said voltages at said negative terminals to said output unit.

11. The apparatus of claim 1, wherein said channels comprise:
a cell temperature channel operable for measuring the cell temperature of said cells, said cell temperature channel comprising:
a first switch;
a resistor coupled to said first switch;
a thermistor coupled to said resistor and operable for outputting a signal that corresponds to said cell temperature; and
a second switch operable for coupling said signal to ground.

12. The apparatus of claim 1, wherein said channels comprise:
a cell current channel operable for measuring the cell current of said cells, said cell current channel comprising:
a resistor; and
a switch coupled to said resistor and operable for outputting a voltage drop across said resistor which is generated in response to said cell current.

13. A self-diagnosis method, comprising:
measuring, using a plurality of channels, a first plurality of signals indicative of status of a battery comprising a plurality of cells, said measuring of said first plurality of signals comprising:
receiving, using a cell voltage channel of said channels, the voltages at positive terminals and negative terminals of said cells; and
outputting, using said cell voltage channel, the cell voltages of said cells according to said voltages at said positive terminals and negative terminals of said cells;

determining if any channel of said channels experiences an abnormal condition;

determining if a converter experiences an abnormal condition;

counting the number of times said channels and said converter experience an abnormal condition; and sending an alert signal when said number reaches a predetermined value.

14. The method of claim 13, wherein said determining if any channel of said channels experiences an abnormal condition comprises:

said converter converting said first plurality of signals into a second plurality of signals; and comparing said second plurality of signals to predetermined ranges.

15. The method of claim 13, wherein said first plurality of signals comprises offsets of said status of said battery.

16. The method of claim 13, wherein said determining if a converter experiences an abnormal condition comprises:

said converter converting a reference signal into a third signal; and comparing said third signal to a second predetermined range.

17. The method of claim 13, wherein said measuring of said first plurality of signals further comprises:

measuring the cell temperature of said cells; and measuring the cell current of said cells.

18. An apparatus, comprising:

a plurality of input terminals operable for receiving a first plurality of signals indicative of status of a battery comprising a plurality of cells; and a measuring circuit coupled to said input terminals, said measuring circuit comprising:

a plurality of analog channels operable for measuring said first plurality of signals, said analog channels comprising a cell voltage channel operable for measuring the cell voltages of said cells, said cell voltage channel comprising:

a multiplexer (MUX) coupled to said cells and operable for outputting the voltages at positive terminals and negative terminals of said cells; and an output unit coupled to said MUX and operable for outputting said cell voltages of said cells;

an analog-to-digital converter (ADC) operable for converting said first plurality of signals into digital signals;

a control block operable for monitoring said analog channels and said ADC and determining if any of said analog channels and said ADC experience an abnormal condition; and a counter coupled to said control block and operable for counting the number of times said analog channels and said ADC experience an abnormal condition.

19. The apparatus of claim 18, wherein said apparatus further comprises an output terminal coupled to said measuring circuit, and wherein said output terminal provides an alert signal when said number reaches a predetermined value.

20. The apparatus of claim 18, wherein said control block determines if any of said analog channels and said ADC experience said abnormal condition at a designated self-diagnosis time.

21. The apparatus of claim 18, wherein said designated self-diagnosis time comprises a time that said apparatus wakes up from a sleep mode.

22. The apparatus of claim 18, wherein said measuring circuit further comprises multiplexer circuitry coupled to said analog channels and said ADC and operable for selecting an instance of said first plurality of signals and providing said instance to said ADC, wherein said multiplexer circuitry comprises said MUX.

23. The apparatus of claim 18, wherein said analog channels are used to measure offsets of said status.

24. The apparatus of claim 23, wherein said abnormal condition of said analog channels is determined by comparing said offsets of said status to a plurality of predetermined ranges.

25. The apparatus of claim 18, wherein said abnormal condition of said ADC is determined using a reference voltage.

* * * * *